United States Patent [19]
Bond et al.

[11] Patent Number: 5,642,261
[45] Date of Patent: Jun. 24, 1997

[54] BALL-GRID-ARRAY INTEGRATED CIRCUIT PACKAGE WITH SOLDER-CONNECTED THERMAL CONDUCTOR

[75] Inventors: Robert H. Bond, Plano; Michael J. Hundt, Double Oak, both of Tex.

[73] Assignee: SGS-Thomson Microelectronics, Inc., Carrollton, Tex.

[21] Appl. No.: 269,203

[22] Filed: Jun. 30, 1994

Related U.S. Application Data

[63] Continuation-in-part of Ser. No. 170,613, Dec. 20, 1993, abandoned, and Ser. No. 225,138, Apr. 8, 1994.

[51] Int. Cl.[6] ........................................ H05K 7/20
[52] U.S. Cl. .................. 361/704; 257/707; 257/713; 361/707; 361/719
[58] Field of Search ............... 174/16.3; 257/706–707, 257/711–712, 717, 720; 361/704, 707–722, 792

[56] References Cited

U.S. PATENT DOCUMENTS

| | | | |
|---|---|---|---|
| 5,172,301 | 12/1992 | Schneider | 361/704 |
| 5,216,278 | 6/1993 | Lin et al. | |
| 5,222,014 | 6/1993 | Lin | 361/792 |
| 5,285,352 | 2/1994 | Pastore et al. | 361/707 |
| 5,291,062 | 3/1994 | Higgins, III | 257/702 |
| 5,311,402 | 5/1994 | Kobayashi et al. | 361/707 |

FOREIGN PATENT DOCUMENTS

| | | |
|---|---|---|
| 0333237 | 9/1989 | European Pat. Off. |
| 376100 | 7/1990 | European Pat. Off. |
| 660399 | 6/1995 | European Pat. Off. |
| 9308842 | 7/1993 | Germany |
| 2-058358 | 2/1990 | Japan ................ 257/712 |
| 3-198368 | 8/1991 | Japan ................ 257/717 |

OTHER PUBLICATIONS

Motorola Technical Developments, vol. 18, Mar. 1993 Schaumburg, Illinois, US, pp. 64–66, T.T. Lee, "A Low Cost Bumpted Thermal Test Chip Assembly".

*Primary Examiner*—Gregory D. Thompson
*Attorney, Agent, or Firm*—Theodore E. Galanthay; Lisa K. Jorgenson

[57] ABSTRACT

An integrated circuit package with a path of high thermal conductivity is disclosed. The package is formed into a substrate, such as a printed circuit board or a ceramic substrate, through which an opening has been formed to receive a thermally conductive slug, formed of a material such as copper. An integrated circuit chip is mounted to one side of the slug, and the opposing surface of the slug is exposed at the underside of the substrate. The chip is wire bonded to the substrate, and is encapsulated in the conventional manner. Solder balls are attached to the underside of the substrate and of the slug in ball-grid-array fashion, for mounting to a circuit board. Upon mounting to the circuit board, a path of high thermal conductivity is provided between the chip and the circuit board, through the slug and the solder balls. According to one of the alternative disclosed embodiments, the slug extends below the surface of the substrate, and has a solder mask with larger apertures than the electrical conductors of the substrate; equivalently sized solder balls may thus be used to connect to the circuit board, to provide larger thermal conductive leads to the slug.

22 Claims, 3 Drawing Sheets

BALL-GRID-ARRAY INTEGRATED CIRCUIT PACKAGE WITH SOLDER-CONNECTED THERMAL CONDUCTOR

This application is a continuation-in-part of application Ser. No. 08/170,613, filed Dec. 20, 1993 now abandoned, entitled "Ball-Grid-Array Integrated Circuit Package with High Thermal Conductivity", and of application Ser. No. 08/225,138, filed Apr. 8, 1994, entitled Ball Grid Array Integrated Circuit Package with "High Thermal Conductivity", incorporated herein by this reference, both such applications assigned to SGS-Thomson Microelectronics, Inc.

This invention is in the field of semiconductor device packages, and is more particularly directed to thermal conduction techniques therein.

BACKGROUND OF THE INVENTION

Advances continue to be made in the manufacture of solid-state electronic devices, resulting in increasing functionality, density and performance of the integrated circuits. The amount of power dissipated, and accordingly the amount of heat generated, by modern integrated circuits generally increases with increases in the density and speed of the circuits. Removal of heat produced by the integrated circuits therefore continues to be of significant concern of modern integrated circuit package and system designers, considering the loss of performance and the degradation in reliability of integrated circuits when operated at elevated temperatures.

In addition, the trend toward more compact electronic systems is also continuing, exacerbating the thermal problem produced by the high-complexity and high-performance integrated circuits. For example, laptop or notebook sized computers have recently become quite popular, with continuing market pressure toward even smaller computer systems such as personal digital assistants (PDAs). However, these small systems eliminate many of the techniques for heat removal available for large-scale computer systems, such as the use of fans for convection cooling of the integrated circuits. As such, many modern systems utilize thermal conduction as the primary mode of heat removal from the integrated circuits in the system.

By way of further background, integrated circuit packages of the ball-grid-array (BGA) type have recently become popular in the field. Conventional BGA packages are similar in layout and arrangement to the pin-grid-array (PGA) packages, in providing a rectangular or square array of connections on the underside of the integrated circuit package. Instead of the pin connectors used in PGA packages, however, BGA packages utilize a solder ball located at each connector location. As is known in the art, the BGA package is attached to a printed circuit board by reflowing the solder balls to make connection to conductors at the surface of the printed circuit board. The BGA package provides the important advantage of being self-aligning, as the surface tension of the solder will tend to pull the BGA package into proper alignment with the corresponding conductors on the printed circuit board.

By way of further background, BGA integrated circuit packages of various types are known, including those of both the "cavity-up" and the "cavity-down" type. Conventional cavity-up BGA packages mount the integrated circuit chip face-up into a cavity (or onto the surface) of the package substrate, attach wire bonds between the package and the chip on this top side, and then either transfer mold or otherwise dispense a plastic over the chip and bond wires to provide environmental protection to the chip and wires. The solder balls are provided on the side of the substrate opposite the chip, and the packaged chip is then mounted to the system printed circuit board. It is known to use plated vias through the substrate at locations underlying the chip, but that are offset from conductors on the printed circuit board to which the packaged chip is mounted, to provide thermal conduction from the chip to its external environment.

Conventional cavity-down integrated circuit packages mount the integrated circuit chip into the cavity of, or onto the surface of, the substrate, followed by attachment of bond wires thereto and molding of the plastic around the chip. In this type of package, the solder balls are provided on the same side of the substrate as the chip, so that the chip is disposed upside-down after attachment of the packaged chip to the circuit board. It is known to mount the chip to a thermally conductive slug disposed within the substrate of a cavity-down package, with the slug exposed on its opposite side from the chip after mounting. A heat sink may be mounted to the exposed upper surface of the slug, so that the heat sink extends upwardly and facilitates convection cooling. This arrangement is not particularly well suited for modern small computing systems, such as laptop, notebook-sized, or hand-held computers, as these systems are not able to house a fan, and indeed are designed to have no convection flow of air within the housing ("zero-air-flow").

It is therefore an object of the present invention to provide an integrated circuit package having improved thermal conduction from the packaged chip to the circuit board upon which it is mounted.

It is a further object of the present invention to provide such a package which is arranged in the cavity-up orientation.

It is a further object of the present invention to provide such a package that is of the ball-grid-array (BGA) type.

It is a further object of the present invention to provide such a package that reduces the need for convection cooling.

It is a further object of the present invention to provide such a package which provides solder connections of larger cross-sectional area for improved thermal conductivity.

It is a further object of the present invention to provide such a package which provides such large area thermal solder connections using the same size solder ball as that used for electrical connections.

Other objects and advantages of the present invention will be apparent to those of ordinary skill in the art having reference to the following specification together with its drawings.

SUMMARY OF THE INVENTION

The invention may be implemented in a ball-grid-array (BGA) package of the cavity-up orientation. A thermally conductive slug, for example formed of copper, is inserted into a cavity of the package substrate; the substrate may itself be formed of a printed circuit board or ceramic substrate of the single, double, or multiple layer type. A surface of the slug is exposed on the underside of the substrate. The integrated circuit chip is attached to the slug, and bonds are made between the bond pads on the chip and the package conductors, followed by encapsulation of the chip by molding or dispensing of a plastic. Solder balls are attached on the underside of the package at locations corresponding to the terminals of the package, and also at locations on the exposed surface of the slug. Upon attachment to the system circuit board, thermal connection is made between the slug and system circuit board conductors, along with electrical connection of the other solder ball connectors to their respective system circuit board terminals. The slug thus provides direct thermal conduction between the chip and the system circuit board, to take advantage of the thermal conductivity of the system circuit board in conducting heat from the chip.

According to another aspect of the present invention, the bottom surface of the slug extends below the bottom surface of the package body, and has a solder mask at its surface with apertures that are larger than the associated wettable surface on the substrate for the electrical connections. The same size solder balls are applied to both the slug and substrate locations. After reflow, the larger solder apertures at the slug in combination with the slug extension below the package body, results in wider solder leads at the slug than for the electrical connections, while using the same size solder ball. The thermal conductivity of the package may therefore be optimized for the particular circuit board application.

DETAILED DESCRIPTION OF THE PREFERRED EMBODIMENTS

Figure 1:
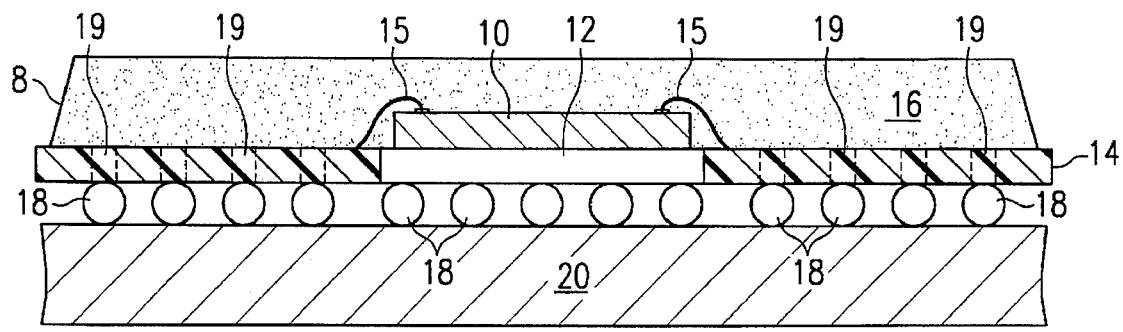
FIG. 1 is a cross-sectional illustration of an integrated circuit package according to the preferred embodiment of the present invention.
Figure 2:
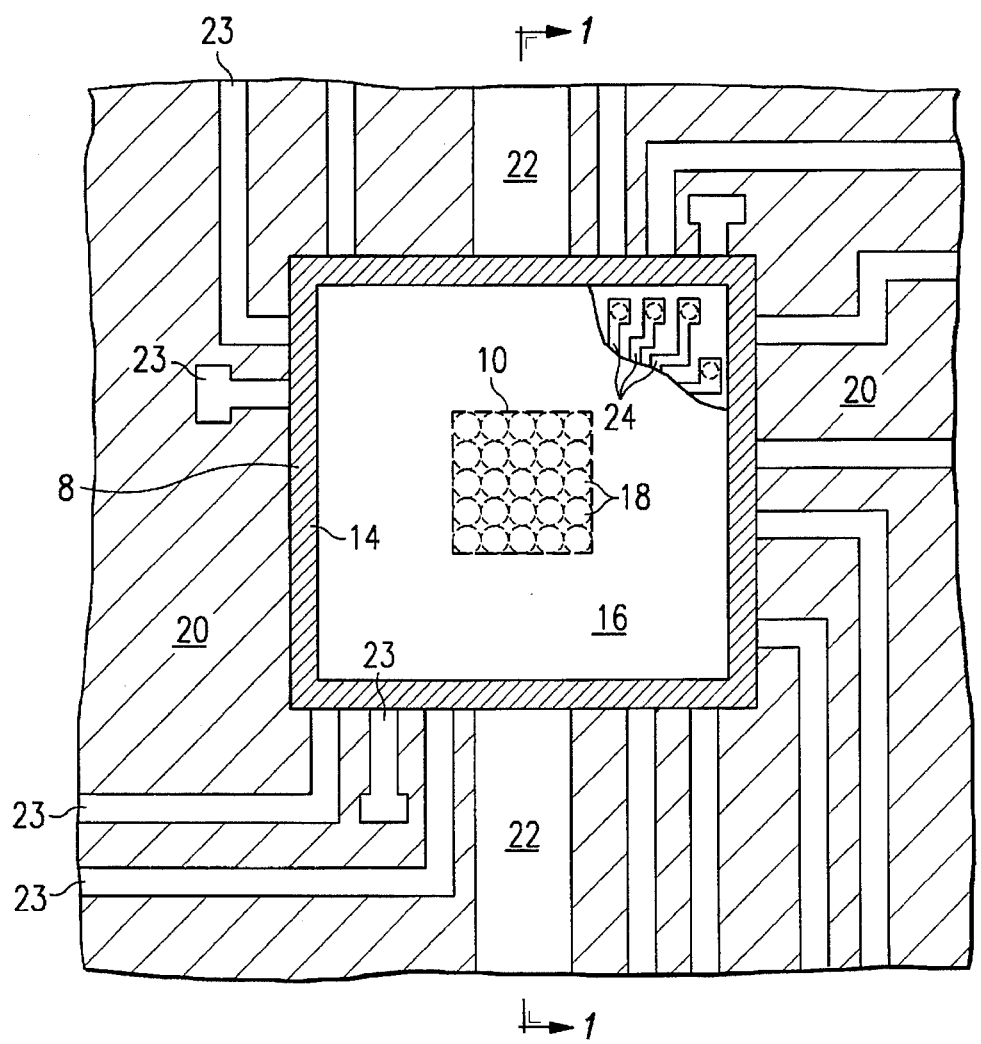
FIG. 2 is a plan view of the integrated circuit package according to FIG. 1, including a cutaway portion.

Referring now to FIGS. 1 and 2, packaged integrated circuit 8 according to a first preferred embodiment of the invention will now be described in detail. The cross-sectional view of the integrated circuit package of FIG. 1 is represented by sectional line 1—1 shown in the plan view of FIG. 2. While packaged integrated circuit 8 according to this embodiment of the invention is shown in each of FIGS. 1 and 2 as already attached to system circuit board 20, it is to be understood by those of ordinary skill in the art that packaged integrated circuit 8 according to this embodiment of the invention will often be individually manufactured and sold, with the purchaser performing the installation of packaged integrated circuit 8 to system circuit board 20 in a computer or other end equipment.

In addition, while the following description is provided using the example of a package containing a single integrated circuit chip, it is of course to be understood that the present invention is also applicable to the packaging or mounting of multiple integrated circuit chips to a board, for example in a hybrid integrated circuit or multichip module.

The active element of packaged integrated circuit 8 is semiconductor chip 10, which is a solid-state integrated circuit device such as a microprocessor, memory, logic device, analog device or other electronic function implemented in a single-chip integrated circuit, as known in the art. According to this embodiment of the invention, chip 10 is attached on its bottom (inactive) surface to conductive slug 12, mounted within substrate 14.

Substrate 14 may be a ceramic substrate, printed circuit board, or other similar substrate having conductors 24 thereupon or therewithin (see FIG. 2) for carrying electrical signals to and from chip 10, and having an opening or receptacle therein within which conductive slug 12 is mounted. Bond wires 15 connect conductors 24 to bond pads on chip 10 in the conventional manner. Plated-through vias 19 make connection between conductors 24 on the top surface of substrate 14 and solder balls 18 on the lower surface of substrate 14. According to this embodiment of the invention, solder balls 18 are arranged in the conventional ball-grid-array manner, and correspond to lands or other surface conductors 23 (see FIG. 2) on the top surface of system circuit board 20 to which packaged integrated circuit 8 is to be mounted. Encapsulant 16, formed of a plastic mold compound, an epoxy, a potting compound, or other conventional integrated circuit encapsulant, covers chip 10 and wires 15 to provide environmental and mechanical protection therefor.

Conductive slug 12 is preferably formed of a material with high thermal conductivity, so that heat from chip 10 may be readily conducted therethrough. In addition, if electrical connection is to be made to the body of chip 10, conductive slug 12 is also preferably electrically conductive. The preferred material for conductive slug 12 is believed to be copper, but other materials known in the art to be thermally conductive and, if desired, electrically conductive, may alternatively be used for slug 12.

Solder balls 18 are also disposed in an array manner beneath and in contact with slug 12, for providing thermal connection between slug 12 and a thermal conductor in system circuit board 20. In the example of FIG. 2, conductive trace 22 is a wide trace on system circuit board 20 that is capable of conducting heat from chip 10 via slug 12 and solder balls 18. Alternatively, where system circuit board 20 is of multilayer construction, slug 12 may be connected by solder balls 18 to a ground plane within system circuit board 20. In either case, conductor 22 or the ground plane may be biased to ground or another substrate bias voltage, in which case slug 12 will also provide the proper ground or bias voltage for chip 10.

The fabrication of packaged integrated circuit 8 begins with the insertion of slug 12 into the corresponding cavity of substrate 14; slug 12 is preferably epoxied into this cavity for mechanical integrity. Chip 10 is then mounted to the top surface of slug 12 by conventional die attach techniques, such as a conductive epoxy or eutectic mount. Bond wires 15 are then attached between substrate 14 and chip 10 by conventional techniques, such as thermocompression or ultrasonic bonding. Upon completion of the wire bond process, encapsulant 16 is formed over chip 10 and wires 15 in the conventional manner. In the example of FIGS. 1 and 2, encapsulate 16 is formed by conventional transfer molding; alternatively, encapsulant 16 may be "globbed" over chip 10 and substrate 14 by dispensation and curing, in the conventional manner. Solder balls 18 are formed on the underside of substrate 14 and slug 12, in the conventional manner, for example by way of a solder mask (not shown) on the underside of substrate 14.

Upon completion of the construction of packaged integrated circuit 8, and any desired electrical testing in packaged form, packaged integrated circuit 8 is ready for mounting to system circuit board 20. Mounting of packaged integrated circuit 8 is preferably done by way of wave soldering or other conventional technique for the surface mounting of BGA packages to circuit boards.

Figure 3:
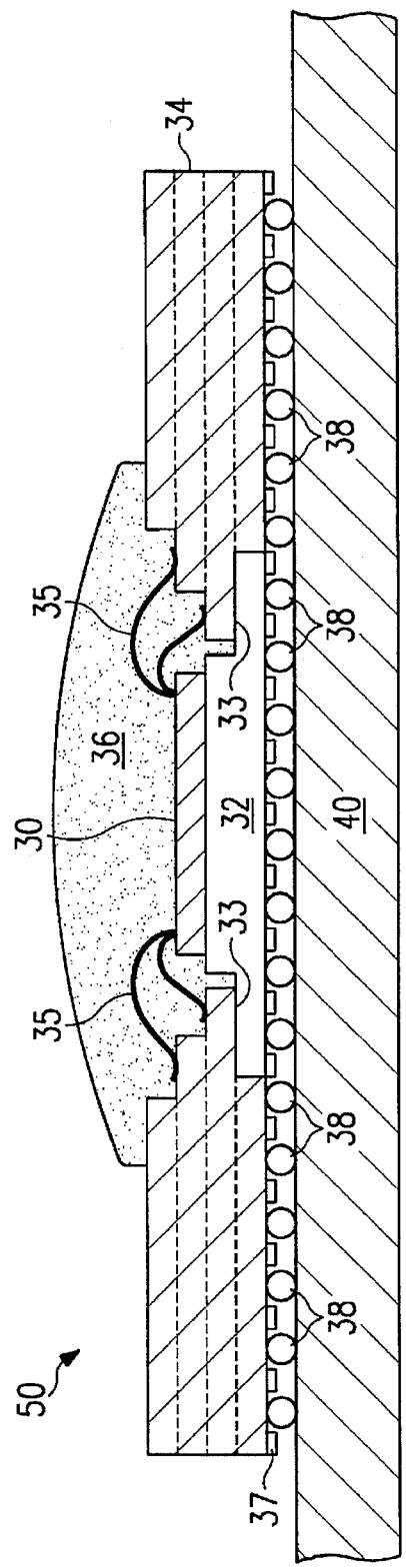
FIG. 3 is a cross-sectional illustration of an integrated circuit package according to an alternative preferred embodiment of the present invention.

FIG. 3 illustrates, in cross-section, packaged integrated circuit 50 according to a second embodiment of the invention. According to this embodiment of the invention, packaged integrated circuit 50 includes chip 30 mounted upon thermally conductive slug 32. Slug 32 is disposed within substrate 34, which in this example is a multilayer circuit board including multiple levels of conductors therewithin. The multiple levels of conductors in substrate 34 are presented by multiple shells of lands, as indicated by the stepped arrangement near the chip cavity of substrate 34. A cutout is provided on the underside of substrate 34, to provide lateral surfaces 33 to which slug 32 may be epoxied or otherwise securely fastened. In this arrangement, slug 32 includes a smaller portion protruding through substrate 34, to which chip 30 is mounted, with larger exposure on the underside of substrate 34. This construction allows for slug 32 to be the proper size for receipt of chip 30 on its top size, providing the maximum area for the arrangement of bond wire lands on substrate 34 with minimum wire length, while maximizing the surface area of thermal conduction on the underside.

Bond wires 35 electrically connect conductors (not shown) in substrate 34 to pads on the surface of chip 30, for connection to the multiple planes of conductors. In this embodiment of the invention, encapsulant 36 is disposed over the cavity of substrate 34, and thus over chip 30 and wires 35. Encapsulant 36 according to this embodiment of the invention is dispensed by way of a syringe or other liquid dispenser, and is then cured in the conventional manner for so-called "chip-on-board" construction.

Solder balls 38 are attached to lands on the bottom surface of substrate 34. Vias (not shown) are provided within substrate 34 to provide electrical connection to the conductors in the substrate. Solder mask 37 on the underside of substrate 34 assists in defining the location of solder balls 38, during their formation in the conventional manner.

As in the first embodiment discussed hereinabove, packaged integrated circuit 50 is attached to system circuit board 40 by way of infrared (IR) solder reflow or other conventional surface mount technology. Those solder balls 38 that are in contact with slug 32 connect to a thermal conductor within system circuit board 40, thus providing a path of relatively low thermal resistance between chip 30 and system circuit board 40 through solder balls 38 and slug 32.

Figure 4:
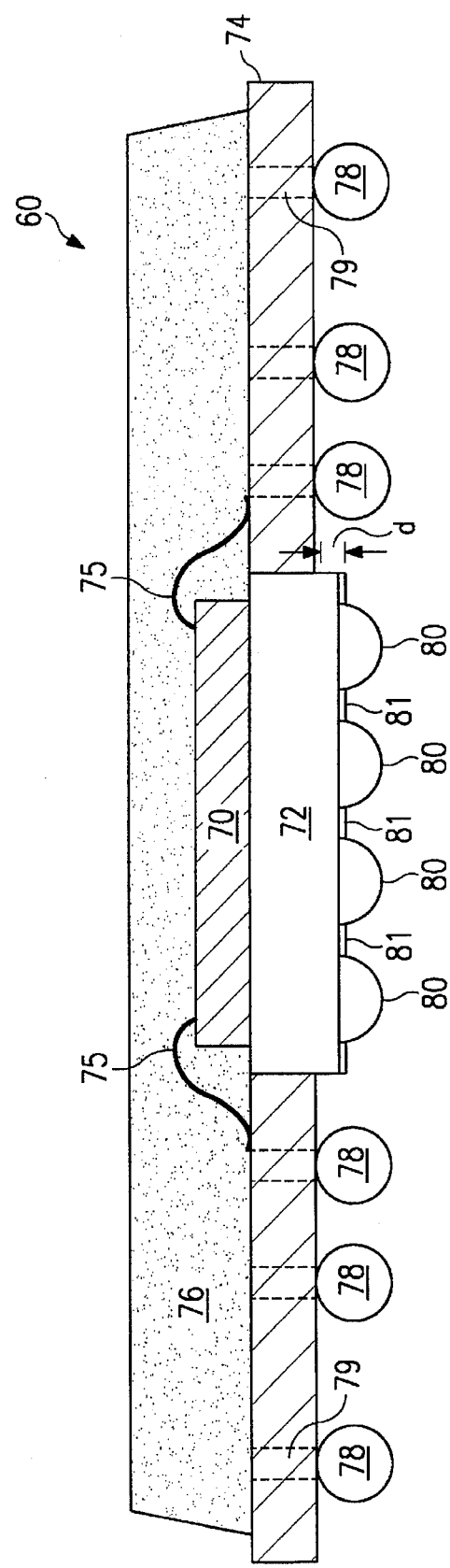
FIG. 4 is a cross-sectional view an integrated circuit package according to another alternative preferred embodiment of the present invention, prior to reflow.

Referring now to FIG. 4, packaged integrated circuit 60 according to another alternative embodiment of the invention is illustrated in cross-section, prior to its mounting to a printed circuit board. Similarly as in the foregoing examples, packaged circuit 60 includes chip 70 mounted upon thermally conductive slug 72. In this embodiment of the invention, slug 72 is disposed mostly within substrate 74, but has a bottom portion which protrudes from the underside of substrate 74 by a selected distance d; the distance d corresponds to the relative size of solder connections to be formed thereunder relative to those used to make the electrical connections, as will be described in detail hereinbelow.

Bond wires 75 electrically connect conductors (not shown) in substrate 74 to pads on the surface of chip 70, in the conventional manner; of course, the connection may be made at multiple levels, where substrate 74 includes multiple planes of conductors, as described hereinabove. In addition, further in the alternative, slug 72 may be formed to have stepped portions to maximize thermal conduction while having a reduced chip mount area, as discussed hereinabove relative to FIG. 3.

Bond wires 75 are then attached between substrate 74 and chip 70 by conventional techniques, such as thermocompression or ultrasonic bonding. Upon completion of the wire bond process, encapsulant 76 is formed over chip 70 and wires 75 in the conventional manner, such as by conventional transfer molding or by dispensing and curing encapsulant 16 thereover.

Figure 5:
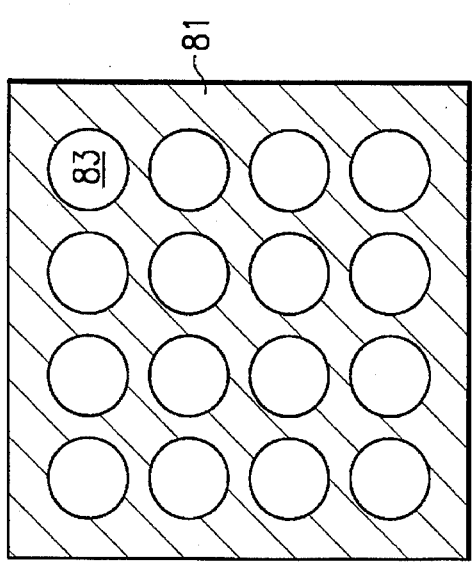
FIG. 5 is a plan view of a solder mask according to the embodiment of the invention of FIG. 4.

Solder balls 78, 80 are next attached to wettable locations, or lands, on the bottom surface of substrate 74 and on the protruding bottom surface of slug 72, respectively. In the case of substrate 74, vias 79 are provided therewithin to provide electrical connection between the conductors in substrate 74 and solder balls 78; a solder mask (not shown) may be used to define the lands, if the construction of substrate 74 itself does not define the locations at which solder balls 78 are defined. The bottom protruding surface of slug 72 is supplied with solder mask 81 on its underside, having apertures therethrough that define the location of solder balls 80 during their formation. Solder mask 81 consists of a photosensitive polymer, applied to, exposed, and developed at the underside of slug 72, in the conventional manner. FIG. 5 illustrates, in plan view, an example of solder mask 81 as applied to the underside of slug 74, and having apertures 83 therethrough; the scale of apertures 83 to the overall size of slug 74 will, of course, vary with the particular application.

As is well known in the art, the application of solder balls 78, 80 to packaged integrated circuit 60 utilizes previously formed solder spheres of the desired diameter. Solder spheres are fabricated by conventional techniques, such as atomization of solder, and are generally received by the integrated circuit manufacturer as incoming piece parts. These solder spheres are applied to the bottom of packaged integrated circuit 60 in the conventional manner, by way of a shaker or other fixture having dispensing holes aligned with lands on the bottom of substrate 74 and with apertures 83 in solder mask 81 on the underside of slug 72. The solder spheres are then subjected to reflow temperatures to create solder balls 78, 80 as shown in FIG. 4, having a shape defined by the size of wettable surface at the contact locations in combination with the surface tension of the reflowed solder.

It will, of course, be appreciated that it is highly desirable and preferable to form solder balls 78, 80 from incoming solder spheres that have a common diameter, such that the same application fixture may be used for packaged integrated circuit 60. It will also be appreciated that the use of differently sized solder spheres to form solder balls 78, 80 would require significantly more complex, and thus costly, assembly equipment, and would also result in more cumbersome inventory management. According to this embodiment of the invention, the different size apertures through solder mask 81 at the protruding bottom surface of slug 74, relative to the size of wettable lands at the bottom of 74, results in solder balls 78, 80 having the same volume, but having radically different shape. As is known in the art, upon dispensation of a solder ball to a wettable surface, exposure of the solder ball to its reflow temperature will cause the solder ball to exhibit a shape corresponding to the size of the wettable surface, as a result of the surface tension of the reflowing solder. Due to the relatively small wettable surfaces, such as at the lands on the underside of substrate 74, solder balls 78 will have a nearly spherical shape. In contrast, the larger apertures at the underside of the protruding portion of slug 72 results in solder balls 80 having a semi-spherical shape.

The relative size of the apertures in solder mask 81 at slug 72 to the wettable lands on the bottom surface 74 depends upon the distance d that slug 72 protrudes from the bottom surface of substrate 74. This is because it is highly desirable for the bottom tangent of each of solder balls 78, 80 to be in coplanar with one another; such a relationship enables reliable contact with a printed circuit board after assembly.

An example of integrated circuit package 60 utilizes solder balls 78, 80 formed from spheres on the order of approximately 0.031 inches in diameter. In this example, substrate 74 has wettable lands that are on the order of 0.025 inches in diameter; for slug 72 protruding approximately 0.010 inches from the bottom surface of substrate 74, apertures in solder mask 81 that are on the order of 0.035 to 0.040 inches in diameter are contemplated to successfully result in excellent thermal conduction between slug 72 and the circuit board. It is contemplated that similar relative dimensions of protrusion depth to wettable surface size, for a given solder ball size, may be readily calculated for other applications.

As in the embodiments of the invention discussed hereinabove, packaged integrated circuit 60 is attached to system circuit board 82 by way of infrared (IR) solder reflow or other conventional surface mount technology. As a result of this process, shown in FIG. 6, solder leads 80' are formed from solder balls 80, and connect slug 72 to a thermal conductor within system circuit board 82, providing a path of relatively low thermal resistance between chip 70 and system circuit board 82 through solder balls 80' and slug 72. Similarly, solder leads 78' are formed from solder balls 78 to electrically connect lands in substrate 74 to electrical conductors in circuit board 82. As is evident from FIG. 6, and considering that each of solder leads 78' and solder leads 80' have approximately the same volume, solder leads 80' have substantially a wider cross-section than do solder leads 78'; the difference in cross-section, of course, arises from the closer proximity of slug 72 to circuit board 82, and from the larger apertures in solder mask 81 relative to lands on substrate 74, given that each of solder balls 78, 80 had substantially the same volume.

In addition to providing good thermal conduction, it is contemplated that solder leads 80' may also be used to provide electrical connection between packaged integrated circuit 60 and circuit board 82, particularly in providing a solid ground path therebetween. In such a case, vias would be provided through circuit board 82 so that solder leads 80' directly connect chip 70 to a ground plane within circuit board 82. The increased width of solder leads 80' thus would provide a low resistance path, both electrically and thermally, between chip 70 (either directly via its substrate or by way of additional wire leads, or both) and the system ground.

For the example described hereinabove, where solder spheres having a diameter of on the order of 0.031 inches were used, and where distance d that slug 74 protruded from the bottom surface of substrate 72 was on the order of approximately 0.010 inches, a typical standoff of solder lead 80' (i.e., the distance between circuit board 82 and the bottom of slug 72) would be on the order of 0.010 inches while a typical standoff of solder lead 78' (i.e., the distance between circuit board 82 and the bottom of substrate 74) would be on the order of 0.020 inches. Since the volume of solder leads 78', 80' would be equivalent, the reduced standoff of leads 80' will translate to a cross-sectional area that, on average, is approximately twice that of leads 78'.

Figure 6:
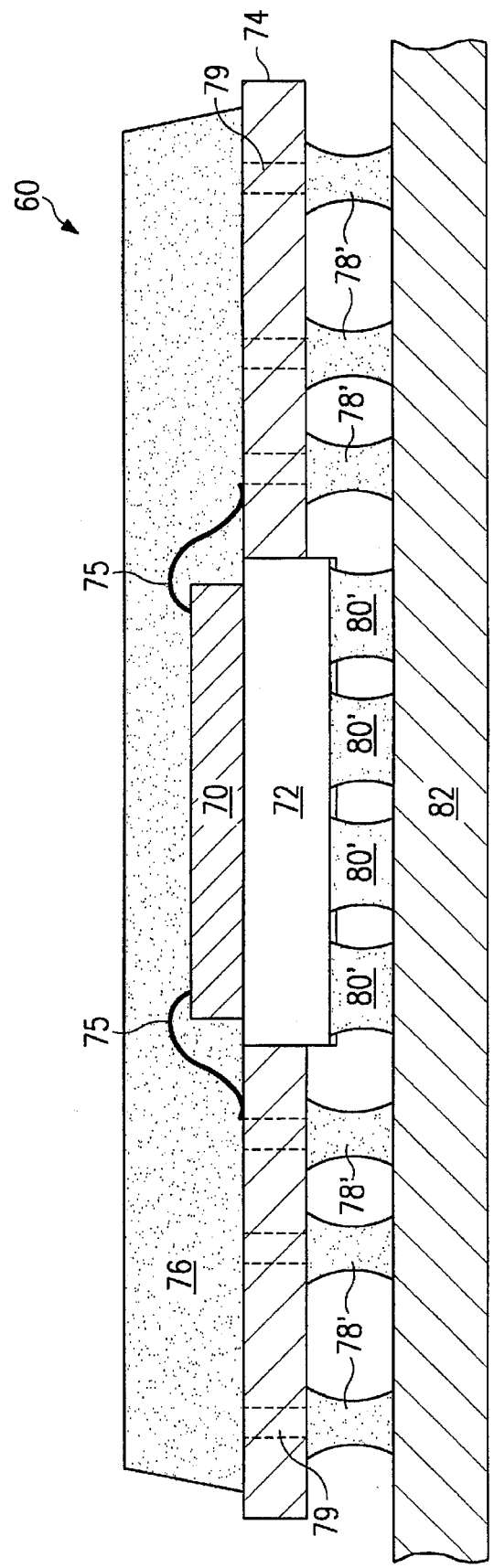
FIG. 6 is a cross-sectional view of the package of FIG. 4, after solder reflow mounting to a circuit board.

According to the embodiment of the invention shown relative to FIGS. 4, 5, and 6, therefore, an integrated circuit package is provided that allows for increased thermal conductivity between the integrated circuit chip and a thermal conductor in the printed circuit board. This increased thermal conductivity is obtained while using the same size solder balls for connection as those used for electrical connections, thus easing the solder ball manufacturing process. In addition, high thermal conductivity is made available for those applications in which the size of thermal conductors in the circuit board is limited.

According to each of these embodiments of the invention, an integrated circuit package is provided which has a high thermal conductivity path is provided between the active integrated circuit therewithin and the system circuit board to which the packaged integrated circuit is mounted. This enables the advantageous use of the system circuit board thermal conductivity to remove heat from the integrated circuit chip via conduction, and as such is suitable for use in zero-air-flow environments such as notebook-size computers, hand-held computing devices such as PDAs, and the like.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A packaged integrated circuit, comprising:
   a substrate having first and second surfaces, having an opening disposed therethrough, and having a plurality of electrical conductors;
   a slug, comprised of a thermally conductive material and having first and second surfaces, said slug having a portion extending through the opening of said substrate so that its first surface is exposed at said first surface of said substrate and extends below the first surface of the substrate, wherein its second surface is coplanar with the second surface of the substrate;
   an integrated circuit chip, mounted to the second surface of said slug, and electrically connected to the conductors of said substrate;
   a first plurality of solder balls disposed at the first surface of said substrate, and in electrical connection with the electrical conductors of said substrate, for making connection to a circuit board; and
   a second plurality of solder balls disposed at the first surface of said slug, for making thermal connection to the circuit board.

2. The packaged integrated circuit of claim 1, wherein each of the first and second pluralities of solder balls have substantially the same volume as one another.

3. The packaged integrated circuit of claim 1, further comprising:
   an encapsulant, disposed over said integrated circuit chip and over a portion of the second surface of said substrate.

4. The packaged integrated circuit of claim 3, wherein said encapsulant comprises molded plastic.

5. The packaged integrated circuit of claim 1, wherein said substrate comprises a printed circuit board.

6. The packaged integrated circuit of claim 5, wherein said printed circuit board is of the multilayer type.

7. The packaged integrated circuit of claim 1, wherein said substrate comprises a ceramic substrate.

8. The packaged integrated circuit of claim 7, wherein said ceramic substrate is of the multilayer type.

9. The packaged integrated circuit of claim 1, wherein said slug comprises copper.

10. The packaged integrated circuit of claim 1, further comprising:

a solder mask, disposed at the first surface of said slug and having apertures therethrough, for defining the location of said second plurality of solder balls.

11. The packaged integrated circuit of claim 10, wherein land portions of the electrical conductors are disposed at the first surface of said substrate;

and wherein each of the apertures in said solder mask are larger than each of the land portions of the electrical conductors at the first surface of said substrate.

12. A method of fabricating a packaged integrated circuit, comprising:

inserting a thermally conductive slug into a substrate having first and second opposing surfaces, said thermally conductive slug having a first surface exposed at and protruding from the first surface of the substrate, and having a second surface opposite therefrom, wherein the second surface of said thermally conductive slug is coplanar with the second surface of the substrate;

mounting an integrated circuit chip to the second surface of the thermally conductive slug;

encapsulating said integrated circuit chip;

attaching a first plurality of solder balls to the substrate at its first surface; and attaching a second plurality of solder balls to the slug at its first surface, wherein each of the second plurality of solder balls have substantially the same volume as each of the first plurality of solder balls.

13. The method of claim 12, further comprising:

defining a solder mask at the first surface of the slug, having apertures at which the second plurality of solder balls are attached.

14. The method of claim 13, wherein the first plurality of solder balls are attached to respective lands at the first surface of the substrate;

and wherein each of the apertures in the solder mask are larger than each of the lands at the first surface of the substrate.

15. The method of claim 12, wherein each of said attaching step comprises:

placing first and second pluralities of solder spheres, each having substantially the same volume, in contact with the first surface of said substrate and the first surface of said slug, respectively; and reflowing the first and second pluralities of solder spheres.

16. The method of claim 12, wherein the encapsulating step comprises:

transfer molding a plastic mold compound over said chip.

17. The method of claim 12, wherein the encapsulating step comprises:

dispensing a plastic over said chip; and curing the dispensed plastic.

18. The method of claim 12, further comprising:

attaching the packaged integrated circuit to a circuit board.

19. An electronic system, comprising:

a printed circuit board, having electrical conductors and a thermal conductor; and a packaged integrated circuit, comprising:

a substrate having first and second surfaces, having an opening disposed therethrough, and having a plurality of electrical conductors;

a slug, comprised of a thermally conductive material and having first and second surfaces, said slug having a portion extending through the opening of said substrate so that its first surface is exposed at said first surface of said substrate and extends below the first surface of the substrate, wherein its second surface is coplanar with the second surface of the substrate;

an integrated circuit chip, mounted to the second surface of said slug, and electrically connected to the conductors of said substrate;

a first plurality of solder leads disposed at the first surface of said substrate, and in electrical connection with the electrical conductors of said substrate and with electrical conductors of said circuit board; and a second plurality of solder leads disposed at the first surface of said slug, for making thermal connection to the thermal conductor of said circuit board.

20. The system of claim 19, wherein each of the first and second pluralities of solder leads have substantially the same volume as one another.

21. The system of claim 19, further comprising:

an encapsulant, disposed over said integrated circuit chip and over a portion of the second surface of said substrate.

22. The system of claim 19, wherein said thermal conductor comprises a ground plane;

and wherein said second plurality of solder leads are in electrical connection with said ground plane.

* * * * *